US010714567B2

(12) United States Patent
Frougier et al.

(10) Patent No.: US 10,714,567 B2
(45) Date of Patent: Jul. 14, 2020

(54) NANOSHEET FIELD-EFFECT TRANSISTOR WITH SUBSTRATE ISOLATION

(71) Applicant: GLOBALFOUNDRIES Inc., Grand Cayman (KY)

(72) Inventors: Julien Frougier, Albany, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 39 days.

(21) Appl. No.: 16/185,881

(22) Filed: Nov. 9, 2018

(65) Prior Publication Data

US 2020/0152734 A1 May 14, 2020

(51) Int. Cl.

| | |
|---|---|
| ***H01L 21/02*** | (2006.01) |
| ***H01L 29/06*** | (2006.01) |
| ***H01L 29/78*** | (2006.01) |

(52) U.S. Cl.

CPC .... *H01L 29/0649* (2013.01); *H01L 21/02601* (2013.01); *H01L 21/02636* (2013.01); *H01L 29/0665* (2013.01); *H01L 29/78* (2013.01)

(58) Field of Classification Search

CPC . H01L 29/0649; H01L 29/0665; H01L 29/78; H01L 21/02601; H01L 21/02636

USPC ............................ 438/128, 129; 257/27, 206

See application file for complete search history.

(56) References Cited

U.S. PATENT DOCUMENTS

| | | | | |
|---|---|---|---|---|
| 4,990,462 | A | 2/1991 | Sliwa, Jr. | |
| 5,075,253 | A | 12/1991 | Sliwa, Jr. | |
| 5,262,336 | A | 11/1993 | Pike, Jr. et al. | |
| 6,855,985 | B2 | 2/2005 | Williams et al. | |
| 10,217,846 | B1 * | 2/2019 | Xie | H01L 21/02505 |
| 2019/0165118 | A1 * | 5/2019 | Leobandung | H01L 29/1079 |

* cited by examiner

*Primary Examiner* — Long K Tran

(74) *Attorney, Agent, or Firm* — Thompson Hine LLP; Yuanmin Cai

(57) ABSTRACT

Structures for a field-effect transistor and methods of forming a structure for a field-effect transistor. A sacrificial layer is epitaxially grown on a bulk semiconductor substrate, a plurality of epitaxial semiconductor layers are epitaxially grown over the sacrificial layer, and the sacrificial layer and the plurality of epitaxial semiconductor layers are patterned to form a fin. A first portion of the first sacrificial layer is removed to form a first cavity arranged between the plurality of epitaxial semiconductor layers and the bulk semiconductor substrate, and a first dielectric material is deposited in the first cavity. A second portion of the first sacrificial layer, which is located adjacent to the first dielectric material in the first cavity, is removed to form a second cavity between the first fin and the bulk semiconductor substrate. A second dielectric material is deposited in the second cavity.

18 Claims, 10 Drawing Sheets

NANOSHEET FIELD-EFFECT TRANSISTOR WITH SUBSTRATE ISOLATION

BACKGROUND

The present invention relates to semiconductor device fabrication and integrated circuits and, more specifically, to structures for a field-effect transistor and methods of forming a structure for a field-effect transistor.

Device structures for a field-effect transistor generally include a source, a drain, and a gate electrode configured to switch carrier flow in a channel between the source and drain. The channel of a planar field-effect transistor is arranged in a semiconductor layer below the gate electrode. When a control voltage exceeding a designated threshold voltage is applied to the gate electrode during operation, carriers flow in the channel between the source and drain to produce a device output current.

Nanosheet field-effect transistors represent a type of non-planar field-effect transistor that may promote additional packing density increases in an integrated circuit. A nanosheet field-effect transistor includes multiple nanosheet channel layers that are arranged in a patterned layer stack over a top surface of a substrate and source/drain regions that are connected with the ends of the nanosheet channel layers. The nanosheet channel layers are initially arranged in the patterned layer stack with sacrificial layers containing a material (e.g., silicon-germanium) that alternate with the nanosheet channel layers and that can be etched selectively to the material (e.g., silicon) constituting the nanosheet channel layers. The source/drain regions may be formed by epitaxially growing semiconductor material from the ends of the nanosheet channel layers and from the substrate adjacent to the layer stack. The sacrificial layers are etched and removed in order to release the nanosheet channel layers and to provide spaces for the formation of a gate stack. Sections of the gate stack may surround all sides of the individual nanosheet channel layers in a gate-all-around arrangement. During operation, the horizontal flow of carriers in the nanosheet channel layers produces the device output current.

To optimize performance, dielectric isolation is needed to electrically isolate the source/drain regions from the substrate in order to suppress leakage current through the substrate beneath the patterned layer stack and the gate stack and between the source/drain regions. An approach is to rely on the buried insulator layer of a silicon-on-insulator substrate to provide the needed dielectric isolation. For a bulk substrate, an approach is to form a punch-through stopper region beneath the patterned layer stack and the gate stack that is effective to suppress the leakage current. However, shallow trench isolation is required during the fabrication process flow to provide support for the nanosheet channel layers when removing the sacrificial layers prior to forming the gate stack.

Improved structures for a field-effect transistor and methods of forming a structure for a field-effect transistor are needed.

SUMMARY

In embodiments of the invention, a method is provided for forming a field-effect transistor. The method includes epitaxially growing a sacrificial layer on a bulk semiconductor substrate, epitaxially growing a plurality of epitaxial semiconductor layers over the sacrificial layer, and patterning the sacrificial layer and the plurality of epitaxial semiconductor layers to form a fin. The method further includes removing a first portion of the first sacrificial layer to form a first cavity arranged between the plurality of epitaxial semiconductor layers and the bulk semiconductor substrate, and depositing a first dielectric material in the first cavity. The method further includes removing a second portion of the first sacrificial layer, which is adjacent to the first dielectric material in the first cavity, to form a second cavity between the first fin and the bulk semiconductor substrate, and depositing a second dielectric material in the second cavity.

In embodiments of the invention, a structure is provided for a field-effect transistor. The structure includes a bulk semiconductor substrate having a top surface, a first body feature including a first plurality of nanosheet channel layers arranged over the top surface of the bulk semiconductor substrate, and a second body feature including a second plurality of nanosheet channel layers arranged over the top surface of the bulk semiconductor substrate. The first body feature is positioned adjacent to the second body feature. The structure further includes a gate structure arranged to respectively surround the first plurality of nanosheet channel layers and the second plurality of nanosheet channel layers. The structure further includes a dielectric layer arranged on the top surface of the bulk semiconductor substrate between the gate structure and the bulk semiconductor substrate. The dielectric layer includes a portion that is laterally arranged between the first body feature and the second body feature, and the bulk semiconductor substrate is free of trench isolation regions beneath the portion of the dielectric layer.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention. In the drawings, like reference numerals are used to indicate like features in the various views.

DETAILED DESCRIPTION

Figure 1:
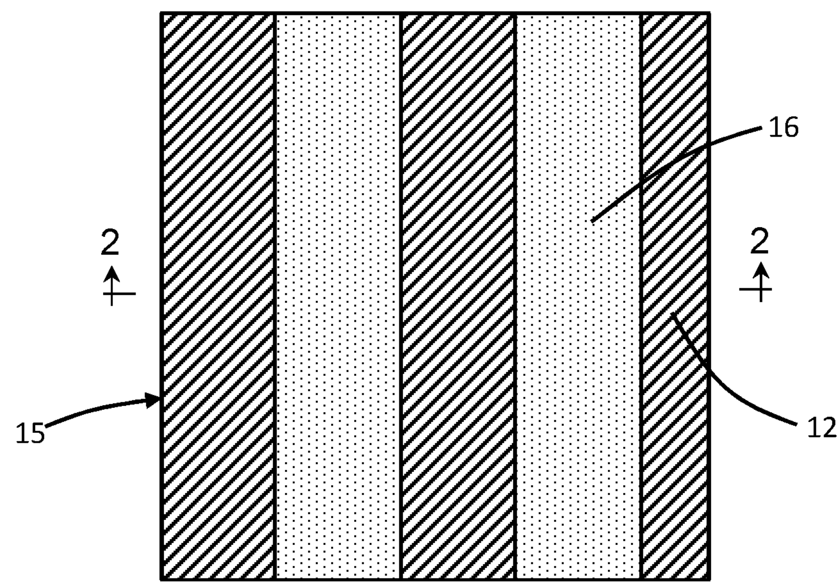
FIG. 1 is a top view of a device structure at an initial fabrication stage of the processing method in accordance with embodiments of the invention.
Figure 2:
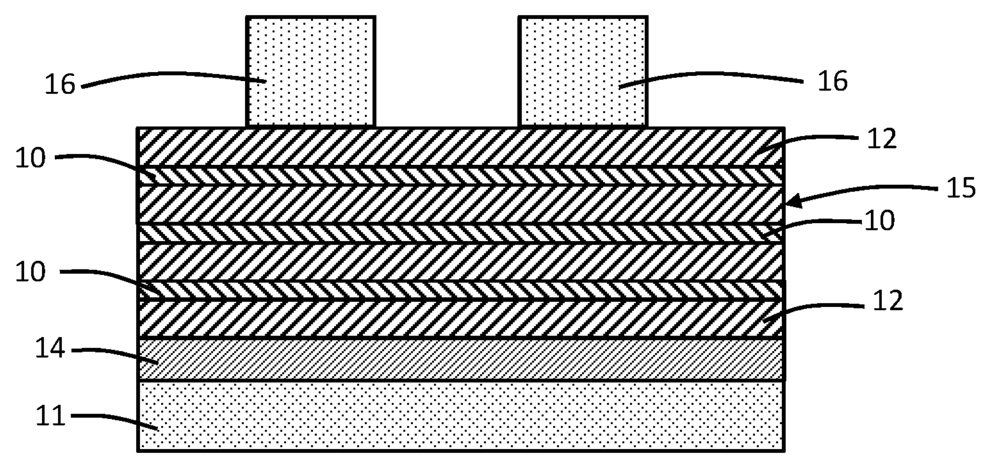
FIG. 2 is a cross-sectional view taken generally along line 2-2 in FIG. 1.

With reference to FIGS. 1, 2 and in accordance with embodiments of the invention, one or more nanosheet channel layers 10, one or more sacrificial layers 12, and a sacrificial layer 14 are arranged in a layer stack 15 that is located on a substrate 11. The sacrificial layer 14 is arranged in a vertical direction between the substrate 11 and the nanosheet channel layers 10 and sacrificial layers 12. The substrate 11 may be composed of a single-crystal semiconductor material, such as single-crystal silicon. The nanosheet channel layers 10, the sacrificial layers 12, and the sacrificial layer 14 may be formed on the substrate 11 by an epitaxial growth process during which the composition is alternated through variation of the reactants supplied to the deposition tool. The number of nanosheet channel layers 10 and sacrificial layers 12 in the layer stack 15 may differ from the number in the depicted representative embodiment and, in particular, may be greater than the number in the representative embodiment through the addition of pairs of nanosheet channel layers 10 and sacrificial layers 12 to the layer stack 15.

The nanosheet channel layers 10 are composed of a single-crystal semiconductor material, and the sacrificial layers 12 are composed of a single-crystal semiconductor material with a composition that is selected to be removed selective to the single-crystal semiconductor material of the nanosheet channel layers 10. The sacrificial layer 14 is composed of a single-crystal semiconductor material with a composition that is selected to be removed selective to the single-crystal semiconductor materials of both the nanosheet channel layers 10 and sacrificial layers 12. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

In an embodiment, the semiconductor material constituting the nanosheet channel layers 10 may be single-crystal silicon, the semiconductor material constituting the sacrificial layers 12 may be single-crystal silicon-germanium that etches at a higher rate than silicon due to its germanium content, and the semiconductor material constituting the sacrificial layer 14 may be silicon-germanium that etches at a higher rate than the sacrificial layers 12 due to a comparatively higher germanium content. In an embodiment, the germanium content of the sacrificial layers 12 may range from fifteen atomic percent (15 at. %) to thirty-five atomic percent (35 at. %), and the germanium content of the sacrificial layer 14 may range from fifty atomic percent (50 at. %) to seventy-five atomic percent (75 at. %).

A hardmask 16 is deposited over the layer stack 15 and then patterned by lithography and etching processes. Sections of the hardmask 16 cover portions of the layer stack 15. The hardmask 16 may be composed of a dielectric material, such as silicon nitride, that is deposited by chemical vapor deposition (CVD).

Figure 3:
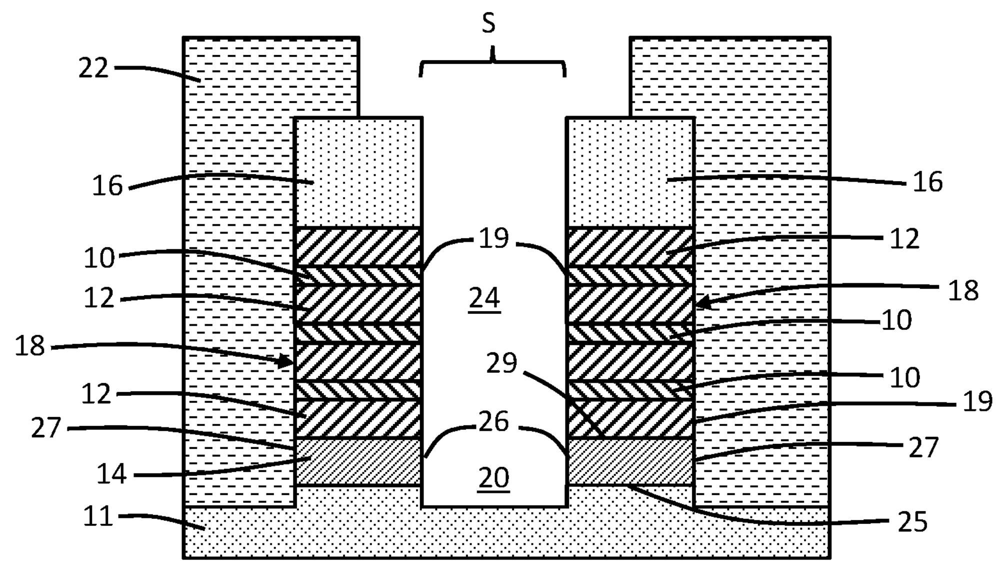
FIGS. 3-12 are cross-sectional views of the device structure at successive fabrication stages of the processing method subsequent to FIG. 2.

With reference to FIG. 3 in which like reference numerals refer to like features in FIG. 2 and at a subsequent fabrication stage of the processing method, the nanosheet channel layers 10, sacrificial layers 12, and sacrificial layer 14 are patterned with an etching process, such as an anisotropic etching process like reactive ion etching, to define fins 18. The pattern of the sections of the hardmask 16 establishes the pattern for the fins 18. The substrate 11 may be etched by the etching process and, in particular, a recess 20 may be defined in the substrate 11 between adjacent sidewalls 19 of the fins 18. The patterned sacrificial layer 14 of each fin 18 includes a side surface 26, another side surface 27 that is opposite from the side surface 26, a top surface 29 that adjoins the lowermost sacrificial layer 12, and a bottom surface 25 that adjoins the substrate 11. The adjacent sidewalls 19 of the fins 18 are separated by a distance, S, and are coplanar with the side surfaces 26, 27.

An etch mask 22 is formed that partially covers each of the fins 18 and that partially exposes each of the fins 18 to the level of the substrate 11. The etch mask 22 may include material from an organic planarization layer (OPL) that is applied as a spin-on hardmask and patterned by lithography and etching processes to provide an opening 24 that provides the partial exposure of the fins 18. In particular, the etch mask 22 exposes the side surface 26 of each sacrificial layer 14 at one sidewall 19 of each fin 18 and masks the opposite side surface 27 of each sacrificial layer 14 on an opposite sidewall 19 of each fin 18.

Figure 4:
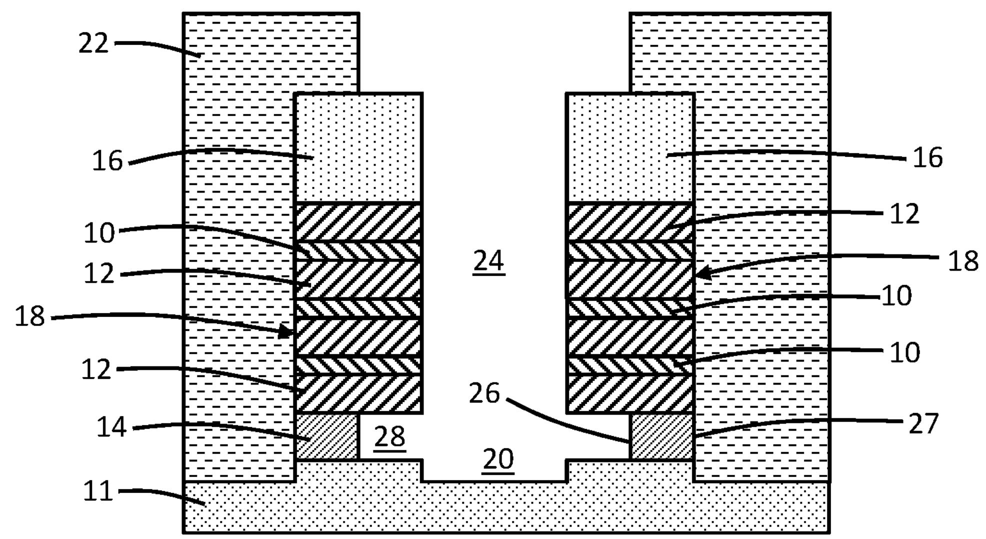

With reference to FIG. 4 in which like reference numerals refer to like features in FIG. 3 and at a subsequent fabrication stage of the processing method, the sacrificial layer 14 of each fin 18 is laterally recessed with an etching process, such as an isotropic wet chemical etching process, that removes the semiconductor material of the sacrificial layer 14 selective to the semiconductor materials the nanosheet channel layers 10, substrate 11, and sacrificial layers 12. The effect of the differences in composition on etch selectivity permits the selective removal of the sacrificial layer 14. The side surface 26 of the recessed sacrificial layer 14 of each fin 18 is arranged beneath the nanosheet channel layers 10 and sacrificial layers 12 of the fin 18. The recessed sacrificial layer 14 is only partially removed such that a cavity 28 is defined as an indent in the sidewall 19 adjacent to each side surface 26. The cavities 28 are arranged in a vertical direction between the lowermost sacrificial layer 12 of each fin 18 and the substrate 11. The side surfaces 27 of each sacrificial layer 14 are protected during the etching process.

Figure 5:
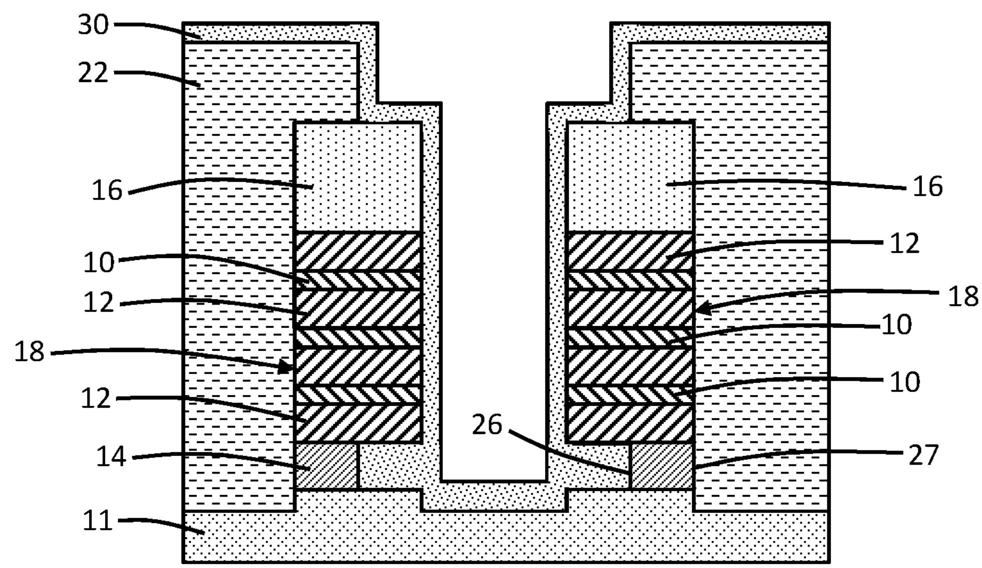

With reference to FIG. 5 in which like reference numerals refer to like features in FIG. 4 and at a subsequent fabrication stage of the processing method, a dielectric layer 30 is deposited that conformally coats the exposed surfaces of the substrate 11, hardmask 16, fins 18, and etch mask 22 as a liner. Material from the dielectric layer also fills the cavities 28 (FIG. 4). In an embodiment, the dielectric layer 30 may be composed of a dielectric material, such as SiN, or a low-k dielectric material such as SiOCN, SiBCN, SiCO, SiOC, or SiC, deposited by plasma-enhanced chemical vapor deposition (PECVD). The dielectric material of the dielectric layer 30 and its formation process are compatible with the material of the etch mask 22 because the dielectric layer 30 is removable from the etch mask 22.

Figure 6:
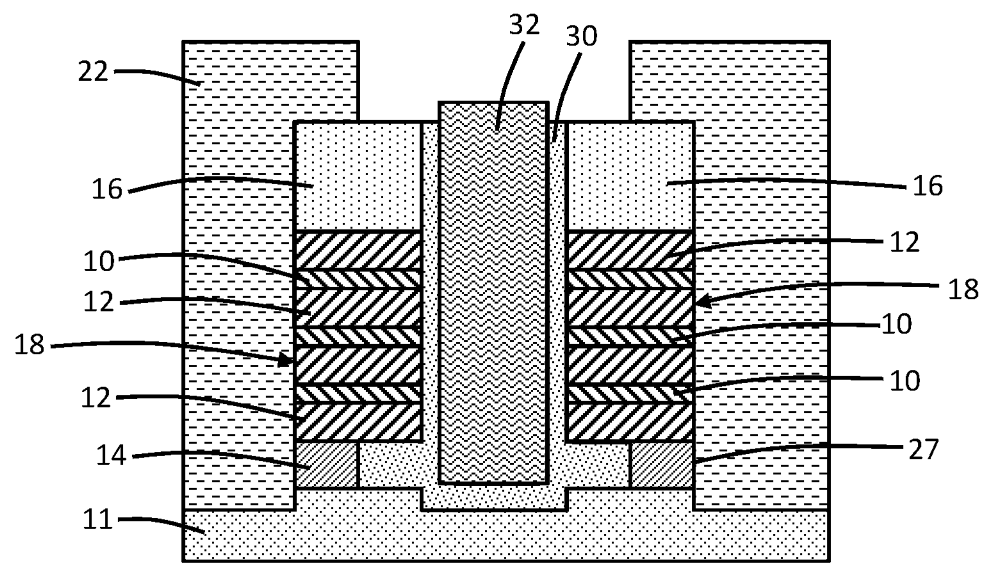

With reference to FIG. 6 in which like reference numerals refer to like features in FIG. 5 and at a subsequent fabrication stage of the processing method, a sacrificial fill layer 32 is deposited and isotropically etched back with an isotropic wet chemical etching process to fill the space between the dielectric layer 30 on the fins 18. The sacrificial fill layer 32 may be composed of a material, such as low-temperature silicon oxide or titanium oxide, that has etch selectivity relative to the dielectric layer of the dielectric layer 30. An etching process, such as an isotropic wet chemical etching process, is then used to remove portions of the dielectric layer 30 that are not masked by the sacrificial fill layer 32. The masked portions of the dielectric layer 30 are arranged between the fins 18.

Figure 7:
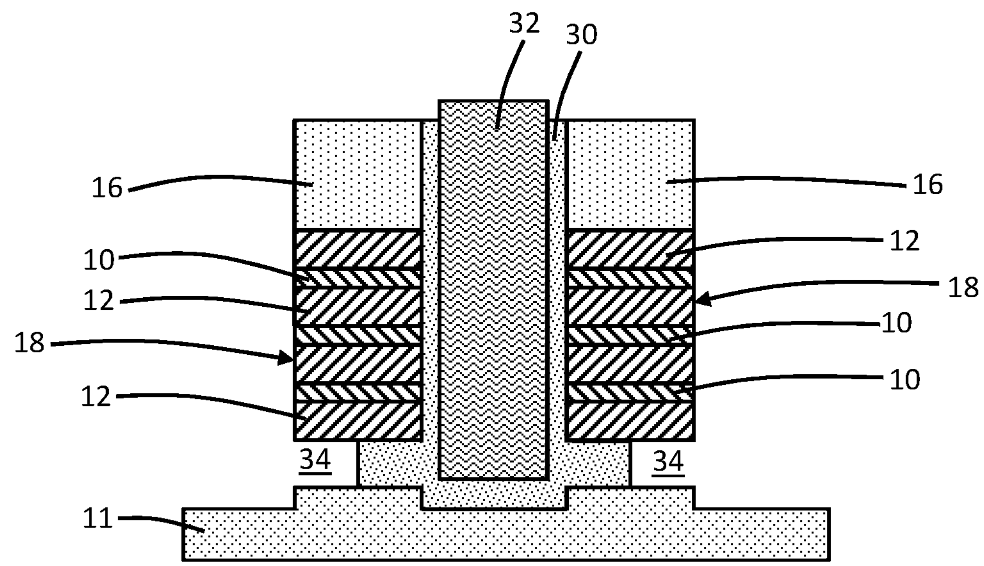

With reference to FIG. 7 in which like reference numerals refer to like features in FIG. 6 and at a subsequent fabrication stage of the processing method, the etch mask 22 is removed by, for example, ashing with an oxygen plasma. The removal of the etch mask 22 exposes one of the side surfaces 26 of the remaining portion of the sacrificial layer 14 at one of the sidewalls 19 of each fin 18. The sacrificial layer 14 of each fin 18 is then laterally etched and fully removed with an etching process, such as an isotropic wet chemical etching process, that removes the semiconductor material of the sacrificial layer 14 selective to the semiconductor materials of the nanosheet channel layers 10, substrate 11, and sacrificial layers 12. As during the initial partial removal of the sacrificial layer 14, the effect of compositional differences on etch selectivity permits the selective removal of the sacrificial layer 14. The removal of the sacrificial layer 14 of each fin 18 defines a cavity 34 that is arranged beneath the nanosheet channel layers 10 and sacrificial layers 12 of each fin 18. Each cavity 34 only occupies a portion of the space beneath the nanosheet channel layers 10 and sacrificial layers 12 with the other portion of the space filled by the dielectric layer 30. Each cavity 34 is arranged in a vertical direction between the lowermost sacrificial layer 12 of the associated fin 18 and the substrate 11. The cavity 34 is arranged adjacent to the dielectric layer 30 and shares a boundary with the dielectric layer 30.

Figure 8:
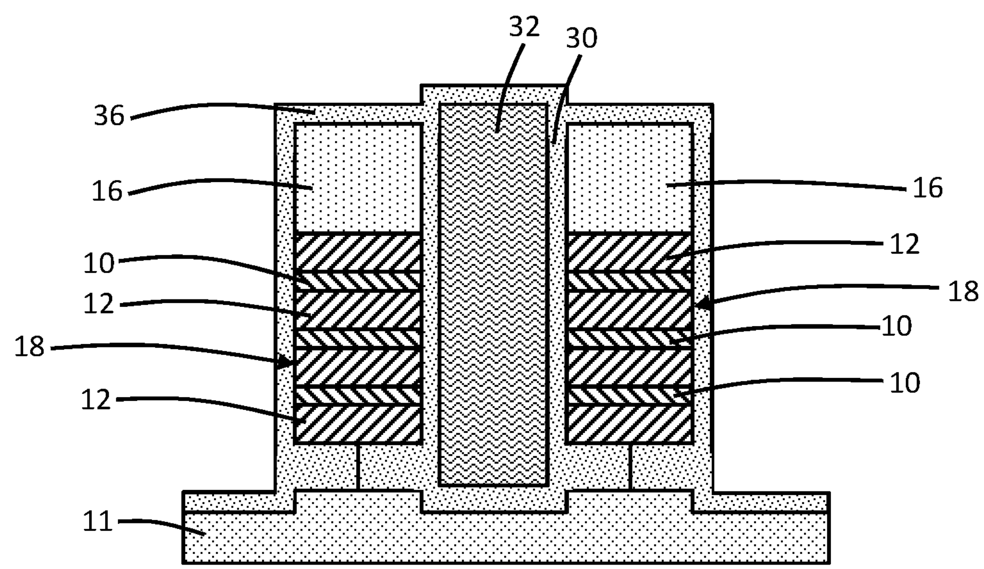

With reference to FIG. 8 in which like reference numerals refer to like features in FIG. 7 and at a subsequent fabrication stage of the processing method, a dielectric layer 36 is deposited that conformally coats the exposed surfaces of the substrate 11, hardmask 16, fins 18, and sacrificial fill layer 32 as a liner. Material from the dielectric layer also fills the cavity 34 (FIG. 7) beneath each fin 18. In an embodiment, the dielectric layer 36 may be composed of a dielectric material, such as SiN, or a low-k dielectric material such as SiOCN, SiBCN, SiCO, SiOC, or SiC, deposited by plasma-enhanced chemical vapor deposition. The dielectric layer 36 is abutted and juxtaposed with the dielectric layer 30 to provide a continuous layer of dielectric material beneath each fin 18.

Figure 9:
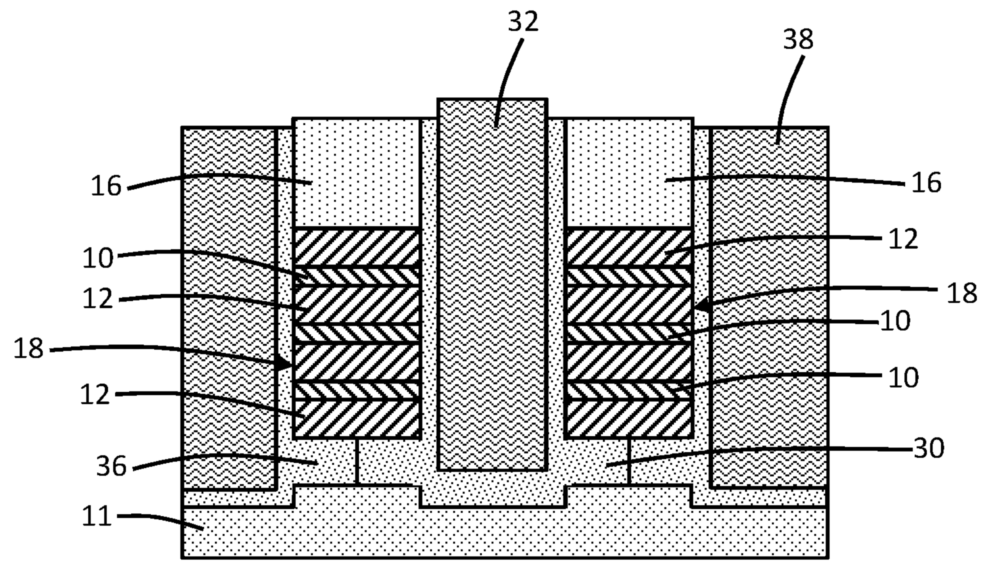

With reference to FIG. 9 in which like reference numerals refer to like features in FIG. 8 and at a subsequent fabrication stage of the processing method, a sacrificial fill layer 38 is deposited and isotropically etched back with an isotropic wet chemical etching process to cover the dielectric layer 36 in the spaces adjacent to the dielectric layer 36 on the fins 18 and over the dielectric layer 36 on the substrate 11. The sacrificial fill layer 38 may be composed of a material, such as low-temperature silicon oxide or titanium oxide, that has etch selectivity relative to the dielectric layer of the dielectric layer 36. An etching process, such as an isotropic wet chemical etching process, is then used to remove portions of the dielectric layer 36 over the sacrificial fill layer 32 and hardmask 16 that are not masked by the sacrificial fill layer 38.

Figure 10:
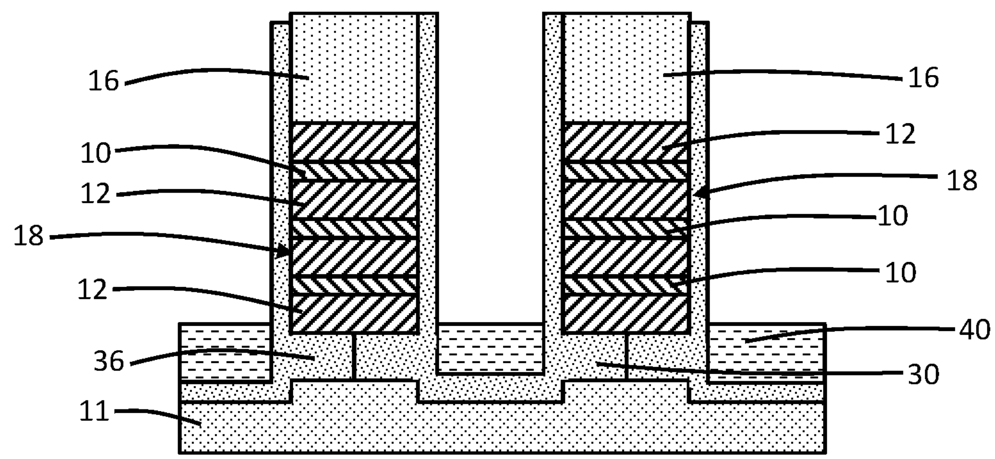

With reference to FIG. 10 in which like reference numerals refer to like features in FIG. 9 and at a subsequent fabrication stage of the processing method, the sacrificial fill layer 32 and the sacrificial fill layer 38 are removed with an etching process to expose the dielectric layer 30 and the dielectric layer 36. An etch mask 40 is applied and recessed with an etching process. The etch mask 40 may include material from an organic planarization layer (OPL) that is applied as a spin-on hardmask. The top surface of the recessed etch mask 40 may be arranged above the interface between the lowermost sacrificial layer 12 in each fin 18 and the portions of the dielectric layers 30, 36 beneath the fins 18.

Figure 11:
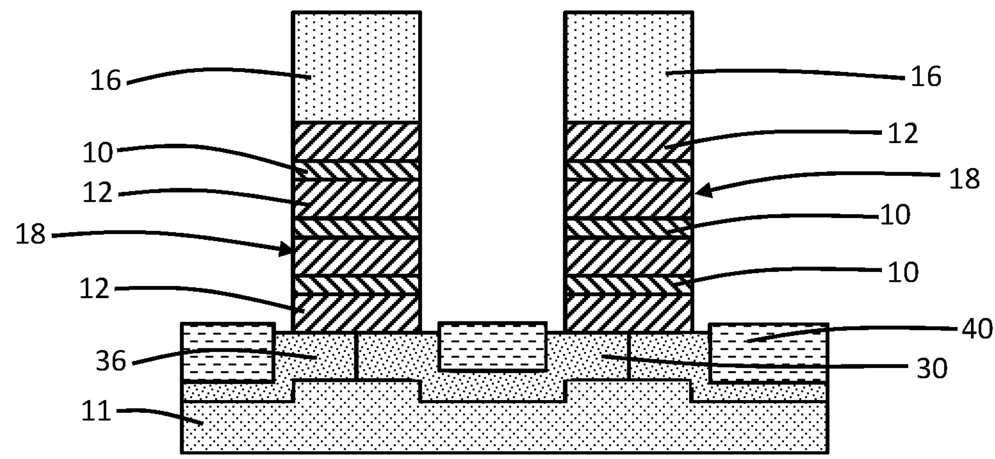

With reference to FIG. 11 in which like reference numerals refer to like features in FIG. 10 and at a subsequent fabrication stage of the processing method, portions of the dielectric layer 30 and the dielectric layer 36 that are exposed and not covered by the etch mask 40 are removed with an etching process that chamfers the dielectric layers 30, 36.

Figure 12:
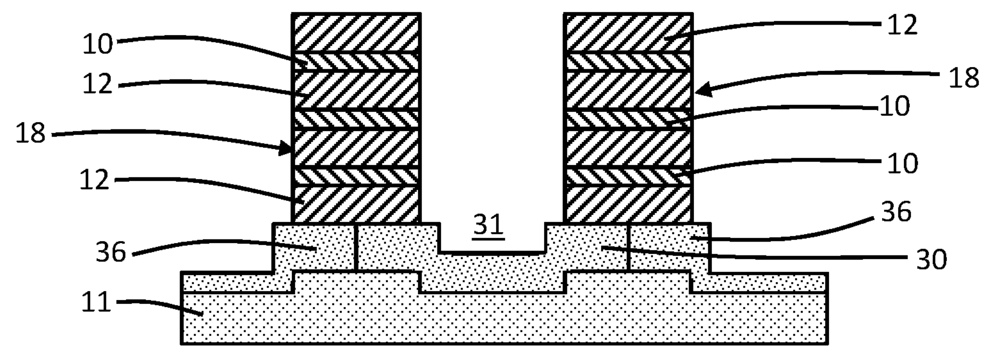

With reference to FIG. 12 in which like reference numerals refer to like features in FIG. 11 and at a subsequent fabrication stage of the processing method, the etch mask 40 is removed to expose the remaining dielectric material of the dielectric layers 30, 36, and the hardmask 16 is removed to expose the fins 18. The portion of the dielectric layer 30, which is conformally deposited on the surfaces of the recess 20 (FIG. 4) in the substrate 11, partially fills the recess 20 and includes a recess 31 that is located between the fins 18.

The dielectric layers 30, 36 provide a continuous layer of dielectric material that is arranged beneath the fins 18 and also arranged over the substrate 11 adjacent to the opposite sidewalls 19 of the fins 18. As such, the dielectric layers 30, 36 electrically isolate the fins 18 and subsequently formed source/drain regions from the substrate 11. The electrical isolation is provided without the need for a silicon-on-insulator wafer. The electrical isolation also obviates the need for shallow trench isolation regions, which may be omitted.

Figure 13:
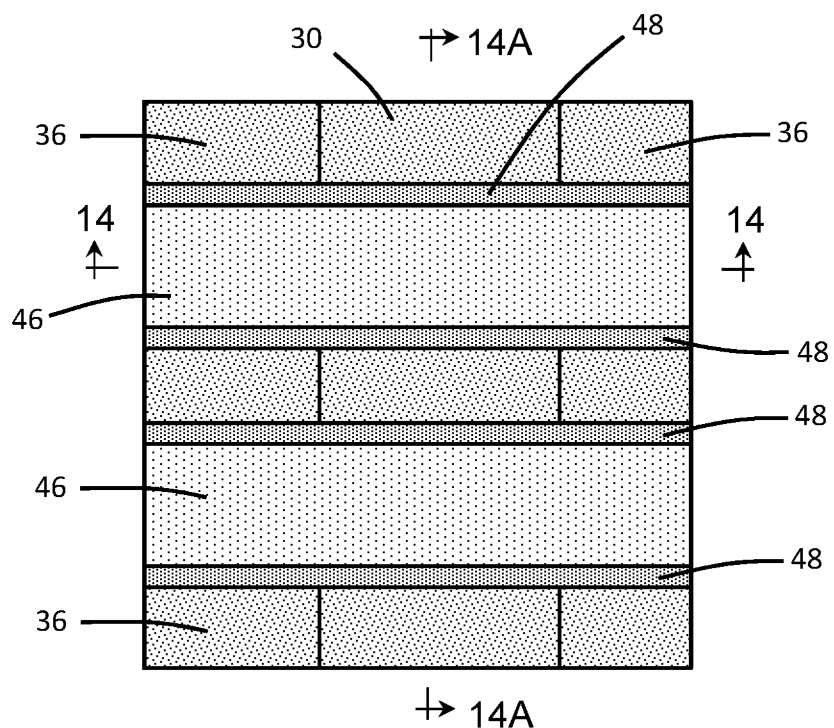
FIG. 13 is a top view of the device structure at a fabrication stage of the processing method subsequent to FIG. 12.
Figure 14:
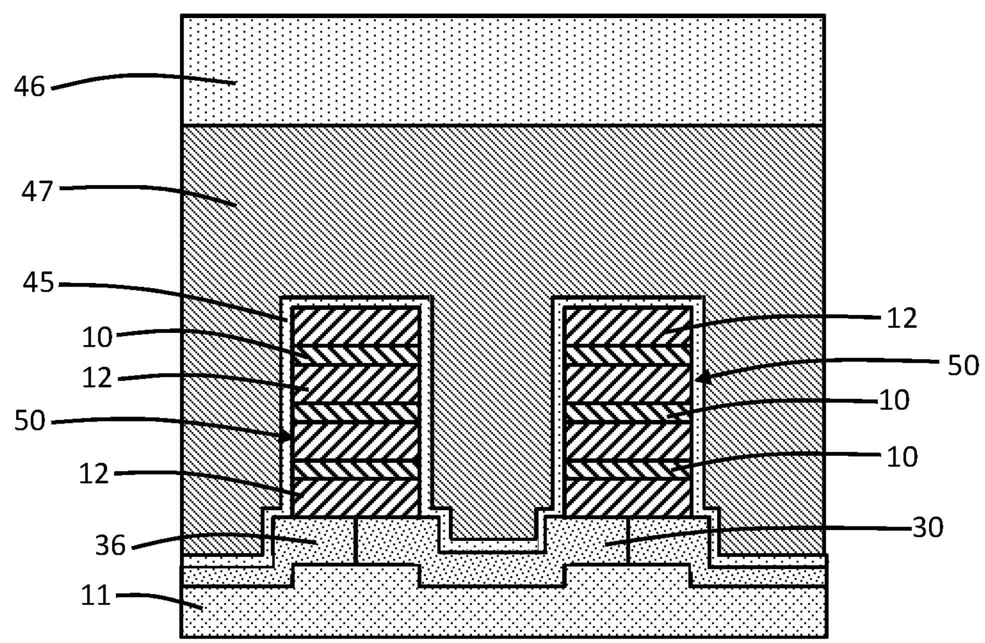
FIG. 14 is a cross-sectional view taken generally along line 14-14 in FIG. 13.
Figure 14A:
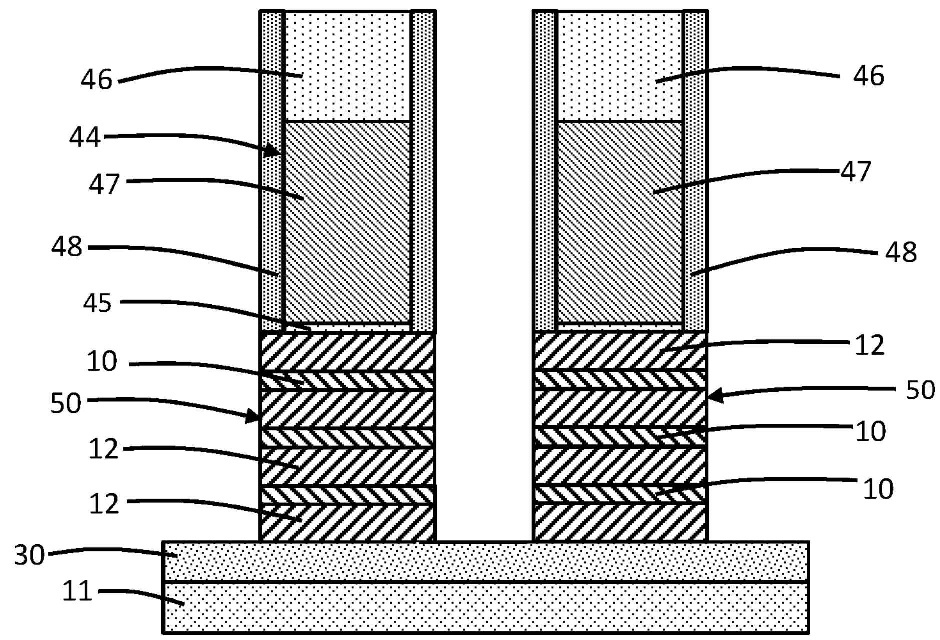
FIG. 14A is a cross-sectional view taken generally along line 14A-14A in FIG. 13.

With reference to FIGS. 13, 14, 14A in which like reference numerals refer to like features in FIG. 12 and at a subsequent fabrication stage of the processing method, sacrificial gate structures 44 are formed that overlap with and wrap around the fins 18. The term "sacrificial gate structure" as used herein refers to a placeholder structure for a gate structure to be subsequently formed. The sacrificial gate structures 44 have a spaced-apart arrangement along the length of each fin 18 and are aligned transverse to the layer stack 15. The sacrificial gate structures 44 may be formed by depositing a sacrificial dielectric layer 45 containing, for example, silicon dioxide arranged adjacent to the fins 18 and a sacrificial layer 47 containing, for example, amorphous silicon over the thin dielectric layer, and patterning the sacrificial dielectric layer 45 and sacrificial layer 47 with lithography and etching processes. A hardmask cap 46 composed of a dielectric material, such as silicon nitride, is arranged over each sacrificial gate structure 44. Sidewall spacers 48 may be formed at the sidewalls of the sacrificial gate structures 44 by depositing a conformal dielectric layer over the sacrificial gate structures 44 and anisotropically etching the conformal dielectric layer.

After forming the sidewall spacers 48, the fins 18 are recessed to divide each fin 18 into body features 50. Each body feature 50 includes nanosheet channel layers 10 and sacrificial layers 12 from the layer stack 15, and source/drain regions are subsequently formed in the spaces between the body features 50. The etching process forming the recesses is self-aligned by the respective sacrificial gate structures 44 and sidewall spacers 48 that effectively operate as an etch mask. The self-aligned etching process, which may be a directional etching process, such as a reactive ion etching process may stop on the dielectric layers 30, 36.

Figure 15:
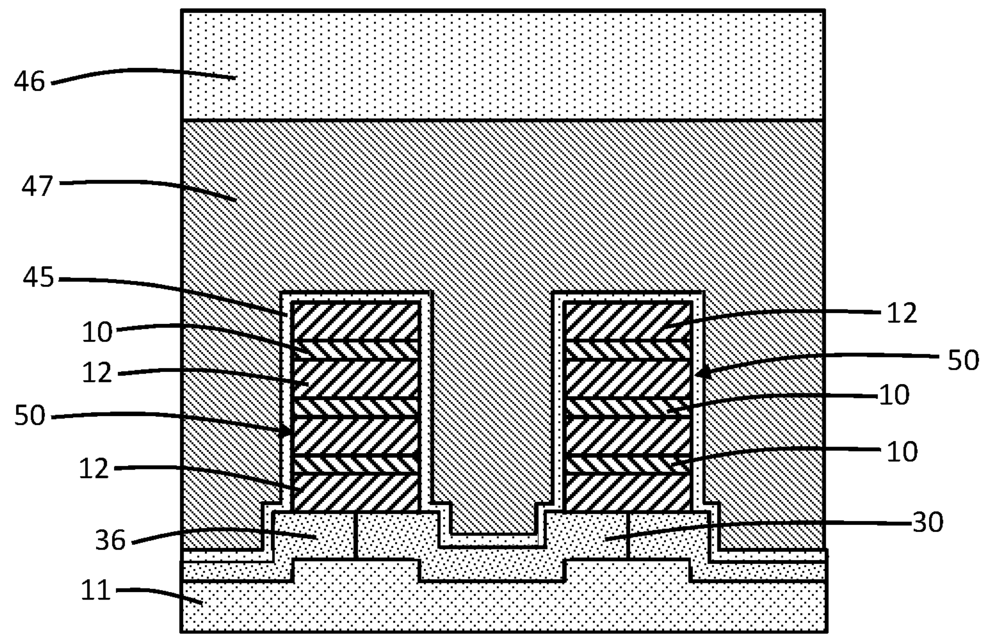
FIGS. 15 and 15A are cross-sectional views of the device structure at successive fabrication stages of the processing method subsequent to FIGS. 14 and 14A.
Figure 15A:
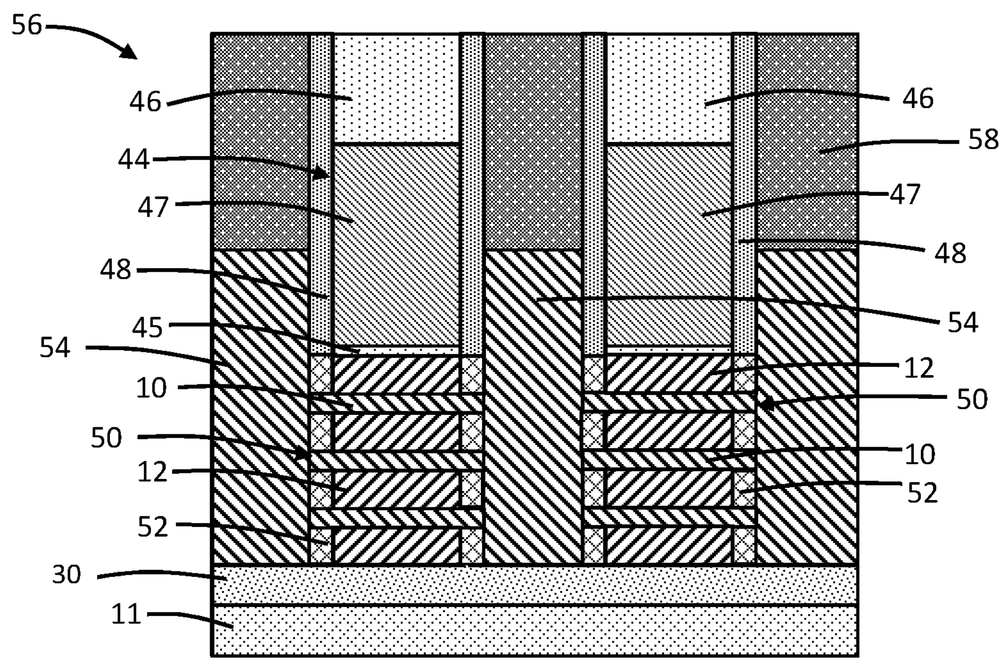

With reference to FIGS. 15, 15A in which like reference numerals refer to like features in FIGS. 14, 14A and at a subsequent fabrication stage of the processing method, inner dielectric spacers 52 are formed by laterally recessing the sacrificial layers 12 relative to the nanosheet channel layers 10 with a selective isotropic etching process to define indents in the body features 50 and filling the indents with a dielectric material. Source/drain regions 54 of a field-effect transistor 56 are formed in the spaces between the body features 50 adjacent to the opposite sidewalls 19 each body feature 50. As used herein, the term "source/drain region"

means a doped region of semiconductor material that can function as either a source or a drain of a field-effect transistor. The source/drain regions 54 may be formed by an epitaxial growth process in which single-crystal semiconductor material grows from growth seeds provided by the nanosheet channel layers 10 and is doped to contain either an n-type dopant or a p-type dopant. The source/drain regions 54 are directly connected with the nanosheet channel layers 10 and are physically isolated from the sacrificial layers 12 by the inner dielectric spacers 52.

A gap-fill layer 58 is deposited and planarized to fill space between the sacrificial gate structures 44 and over the source/drain regions 54. The gap-fill layer 58 may be composed of a dielectric material, such as silicon dioxide, deposited by chemical vapor deposition and may be planarized by chemical-mechanical polishing (CMP). The planarization removes the hardmask caps 46 to reveal the sacrificial gate structures 44.

Figure 16:
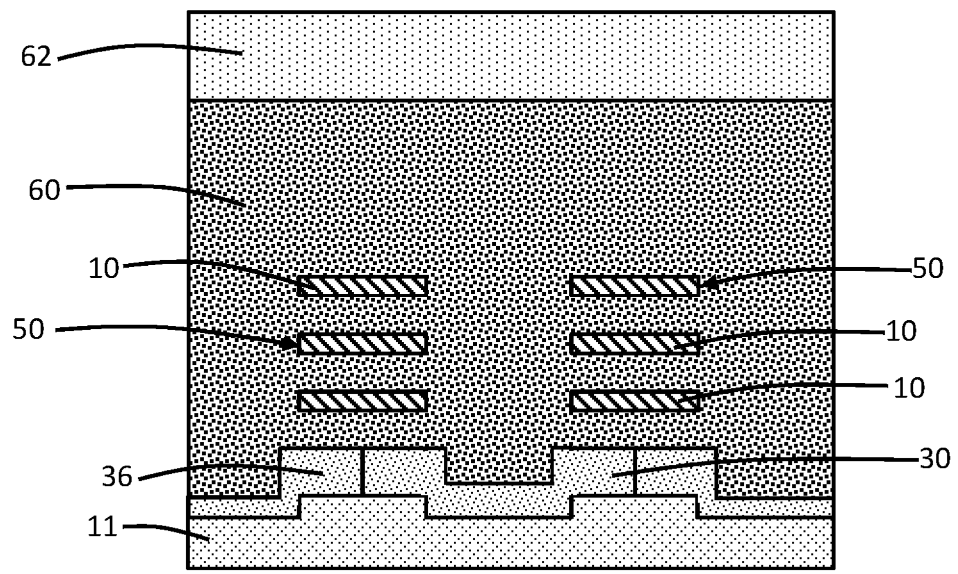
FIGS. 16 and 16A are cross-sectional views of the device structure at successive fabrication stages of the processing method subsequent to FIGS. 15 and 15A.
Figure 16A:
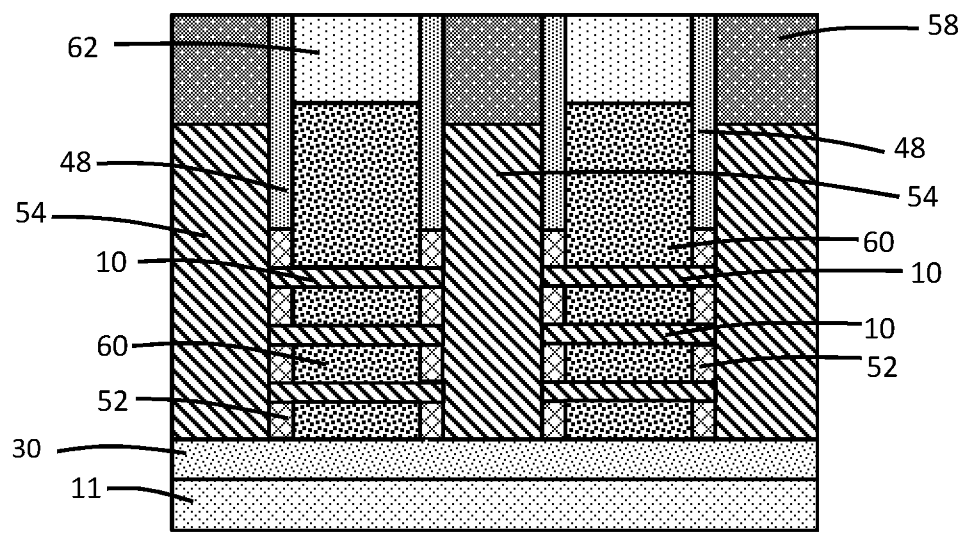

With reference to FIGS. 16, 16A in which like reference numerals refer to like features in FIGS. 15, 15A and at a subsequent fabrication stage of the processing method, the sacrificial gate structures 44 are removed with one or more etching processes. The sacrificial layers 12 are subsequently removed with an etching process that removes the material of the sacrificial layers 12 selective to the materials of the nanosheet channel layers 10 and inner dielectric spacers 52.

Gate structures 60 are formed in the spaces opened by the removal of the sacrificial gate structures 44 and sacrificial layers 12 to complete the formation of the field-effect transistor 56 in a replacement gate process. The gate structures 60 may include an interface layer coating the nanosheet channel layers 10, a gate dielectric layer composed of a dielectric material, such as a high-k dielectric, and a metal gate electrode composed of one or more barrier metal layers and/or work function metal layers, such as titanium aluminum carbide (TiAlC) or titanium nitride (TiN), and a metal gate fill layer that is comprised of a conductor, such as tungsten (W). The interface layer and gate dielectric layer are arranged between the gate electrode and the exterior surface of the nanosheet channel layers 10.

The nanosheet channel layers 10 are arranged in a vertical stack and sections of each gate structure 60 are located in the spaces formerly occupied by the removed sacrificial layers 12. The sections of each gate structure 60 may surround an exterior surface of the nanosheet channel layers 10 in a gate-all-around arrangement. The nanosheet channel layers 10 function as channels for carrier flow that are formed during operation of the field-effect transistor.

Self-aligned contact (SAC) caps 62 composed of a dielectric material, such as silicon nitride, are formed in the spaces between the sidewall spacers 48 and over each of the gate structures 60. The gap-fill layer 58 may be removed and trench silicide contacts (not shown) may be formed in the opened spaces that extend to contact the source/drain regions 54.

Middle-of-line (MOL) and back-end-of-line (BEOL) processing are subsequently used to form an interconnect structure that is coupled with the field-effect transistor 56.

Figure 17:
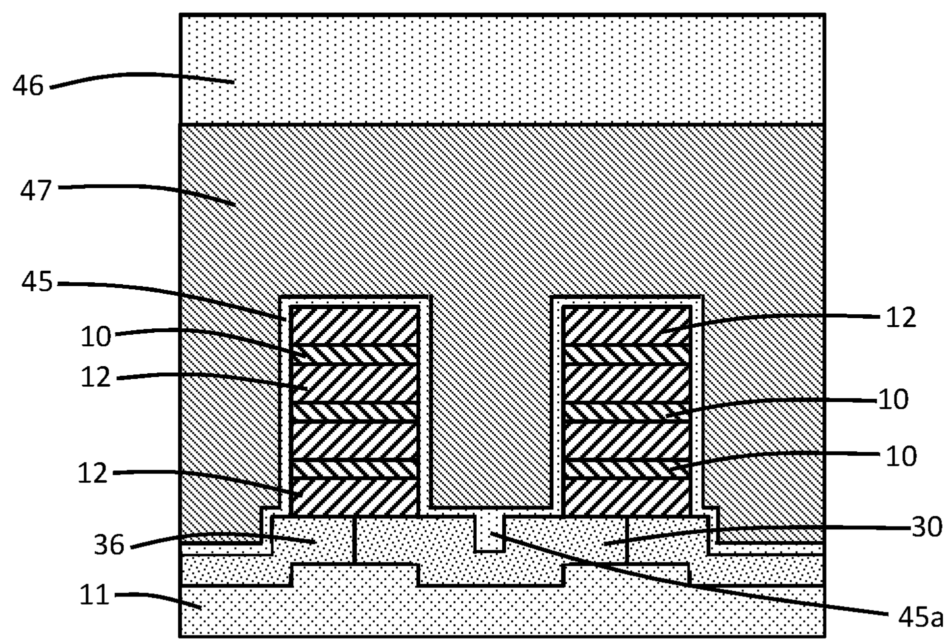
FIG. 17 is a cross-sectional view of a device structure at a fabrication stage of a processing method in accordance with alternative embodiments of the invention.

With reference to FIG. 17 in which like reference numerals refer to like features in FIG. 12 and in accordance with alternative embodiments of the invention, the thickness of the dielectric layer 30 may be increased when deposited such that the recess 31 (FIG. 12) between the fins 18 is narrowed. Due to the narrowing, a portion 45*a* of the sacrificial dielectric layer 45 of the sacrificial gate structures 44 may have the ability fill the recess 31 by pinch-off during its deposition, as opposed to merely coating the surfaces of the substrate 11 surrounding the recess 20 as a conformal layer. In this instance, the narrowed recess 31 is filled by portion 45*a* of the sacrificial dielectric layer 45 that may be coplanar with the surrounding material of the dielectric layer 30 after the sacrificial gate structures 44 are removed and the gate structures 60 are formed in the replacement metal gate process. The portion 45*a* of the sacrificial dielectric layer 45, which may be composed of silicon dioxide, residing in the recess 31 may prevent metal from the metal gate electrode or epitaxial semiconductor material from the source/drain regions 54 from being introduced into the recess 31. The processing method continues as described in the context of FIGS. 13, 14, 14A through FIGS. 16, 16A to complete the field-effect transistor 56.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a field-effect transistor, the method comprising:

epitaxially growing a first sacrificial layer on a bulk semiconductor substrate;

epitaxially growing a plurality of epitaxial semiconductor layers over the first sacrificial layer;

patterning the first sacrificial layer and the plurality of epitaxial semiconductor layers to form a first fin;

removing a first portion of the first sacrificial layer to form a first cavity arranged between the plurality of epitaxial semiconductor layers and the bulk semiconductor substrate;

depositing a first dielectric material in the first cavity;

removing a second portion of the first sacrificial layer adjacent to the first dielectric material in the first cavity to form a second cavity between the first fin and the bulk semiconductor substrate; and depositing a second dielectric material in the second cavity.

2. The method of claim 1 wherein removing the first portion of the first sacrificial layer to form the first cavity arranged between the plurality of epitaxial semiconductor layers and the bulk semiconductor substrate comprises:

laterally recessing a first side surface of the first sacrificial layer relative to a first sidewall of the first fin with a first etching process.

3. The method of claim 2 wherein the first sacrificial layer includes a second side surface opposite from the first side surface, and the method further comprising:

applying a first etch mask that covers the second side surface during the first etching process.

4. The method of claim 3 further comprising:

removing the first etch mask to expose the second side surface; and laterally recessing the second side surface of the first sacrificial layer relative to a second sidewall of the first fin with a second etching process.

5. The method of claim 4 wherein the first dielectric material in the first cavity has an abutted and juxtaposed relationship with the second dielectric material in the second cavity.

6. The method of claim 3 wherein a second fin is patterned from the first sacrificial layer and the plurality of epitaxial semiconductor layers, the first etch mask includes an opening that exposes the first sidewall of the first fin, a second sidewall of the second fin, and a portion of the bulk semiconductor substrate between the first sidewall of the first fin and the second sidewall of the second fin, and the first dielectric material further deposits on the first etch mask, the first sidewall of the first fin, the second sidewall of the second fin, and the portion of the bulk semiconductor substrate.

7. The method of claim 6 further comprising:

depositing a sacrificial fill material to cover the first dielectric material on the portion of the bulk semiconductor substrate; and after depositing the sacrificial fill material, removing the first dielectric material from the first etch mask.

8. The method of claim 7 further comprising:

removing the sacrificial fill material from the first dielectric material on the portion of the bulk semiconductor substrate; and after removing the sacrificial fill material, chamfering the first dielectric material.

9. The method of claim 6 wherein the portion of the bulk semiconductor substrate includes a first recess, the first dielectric material over the first recess in the portion of the bulk semiconductor substrate includes a second recess, and further comprising:

forming a sacrificial gate structure that overlaps with a portion of the first fin and that overlaps with a portion of the second fin, wherein the sacrificial gate structure includes a conductor layer and a dielectric layer arranged between the respective portions of the first fin and the second fin, and a portion of the dielectric layer is arranged in the second recess.

10. The method of claim 1 wherein the first dielectric material in the first cavity and the second dielectric material in the second cavity have an abutted and juxtaposed relationship.

11. The method of claim 1 wherein the plurality of epitaxial semiconductor layers include a plurality of nanosheet channel layers and a plurality of second sacrificial layers, the plurality of second sacrificial layers being arranged in the first fin to alternate with the plurality of nanosheet channel layers.

12. The method of claim 11 wherein the first sacrificial layer has a first composition, the plurality of second sacrificial layers have a second composition, and the second composition is selected relative to the first composition such that the first sacrificial layer is removable selective to the plurality of second sacrificial layers.

13. The method of claim 11 wherein the plurality of second sacrificial layers are comprised of a first single-crystal silicon-germanium with a first germanium content, and the first sacrificial layer is comprised of a second single-crystal silicon-germanium with a second germanium content that is greater than the first germanium content of the first single-crystal silicon-germanium.

14. The method of claim 13 wherein the plurality of nanosheet channel layers are comprised of single-crystal silicon.

15. The method of claim 1 further comprising:

after depositing the second dielectric material in the second cavity, forming a gate structure that extends across a portion of the first fin, wherein the first dielectric material and the second dielectric material are arranged between the gate structure and the bulk semiconductor substrate.

16. The method of claim 1 wherein the first dielectric material deposits as a first dielectric layer on a first portion of the bulk semiconductor substrate adjacent to a first sidewall of the first fin, and further comprising:

epitaxially growing a semiconductor material from the plurality of epitaxial semiconductor layers to form a first source/drain region, wherein the first source/drain region is arranged over the first dielectric layer.

17. The method of claim 16 wherein the second dielectric material deposits as a second dielectric layer on a first portion of the bulk semiconductor substrate adjacent to a second sidewall of the first fin, and the semiconductor material is epitaxially grown from the plurality of epitaxial semiconductor layers to form a second source/drain region, wherein the second source/drain region is arranged over the second dielectric layer.

18. The method of claim 1 wherein a second fin is patterned from the first sacrificial layer and the plurality of epitaxial semiconductor layers, the first dielectric layer deposits on a portion of a top surface of the bulk semiconductor substrate between a first sidewall of the first fin and a second sidewall of the second fin, and the portion of the bulk semiconductor substrate is free of trench isolation regions beneath the top surface of the bulk semiconductor substrate.

* * * * *